US 7,081,640 B2

(12) United States Patent
Uchida et al.

(10) Patent No.: US 7,081,640 B2
(45) Date of Patent: Jul. 25, 2006

(54) ORGANIC SEMICONDUCTOR ELEMENT HAVING HIGH INSULATION STRENGTH AND FABRICATION METHOD THEREOF

(75) Inventors: Yoshihiko Uchida, Tsurugashima (JP); Kenji Nakamura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/765,220

(22) Filed: Jan. 28, 2004

(65) Prior Publication Data

US 2004/0251474 A1 Dec. 16, 2004

(30) Foreign Application Priority Data

Jan. 29, 2003 (JP) .............................. 2003-019995

(51) Int. Cl.
*H01L 35/24* (2006.01)
(52) U.S. Cl. ...................... 257/40; 257/642; 257/759; 438/82; 438/99
(58) Field of Classification Search ................ 257/40, 257/642, 643, 759; 438/82, 99
See application file for complete search history.

(56) References Cited

U.S. PATENT DOCUMENTS

| 5,355,235 | A  | * | 10/1994 | Nishizawa et al. ............ 349/43 |
| 5,532,853 | A  | * | 7/1996  | Song et al. .................. 349/149 |
| 5,705,826 | A  | * | 1/1998  | Aratani et al. ................ 257/40 |
| 5,946,551 | A  | * | 8/1999  | Dimitrakopoulos et al. .. 438/99 |
| 6,207,472 | B1 | * | 3/2001  | Callegari et al. ............. 438/99 |
| 6,278,127 | B1 | * | 8/2001  | Dodabalapur et al. ........ 257/40 |
| 6,313,889 | B1 | * | 11/2001 | Song et al. ................... 349/54 |
| 6,344,660 | B1 | * | 2/2002  | Dimitrakopoulos et al. .. 257/40 |
| 6,734,038 | B1 | * | 5/2004  | Shtein et al. ................. 438/99 |

OTHER PUBLICATIONS

Lightweight and Flexible Organic Transistors Will Change the Style of Displays (NIKKEI ELECTRONICS 2001.10.8).

* cited by examiner

*Primary Examiner*—Andy Huynh
(74) *Attorney, Agent, or Firm*—Sughrue Mion, PLLC

(57) ABSTRACT

The present invention provides an organic semiconductor element in which the insulation strength of the insulation layer and the carrier mobility of the organic semiconductor are both high. The semiconductor layer is an organic semiconductor element consisting of an organic compound. A gate oxide film consisting of an oxide of the gate electrode material is provided between the gate electrode and the gate insulation layer. The gate insulation layer consists of an organic compound.

14 Claims, 3 Drawing Sheets

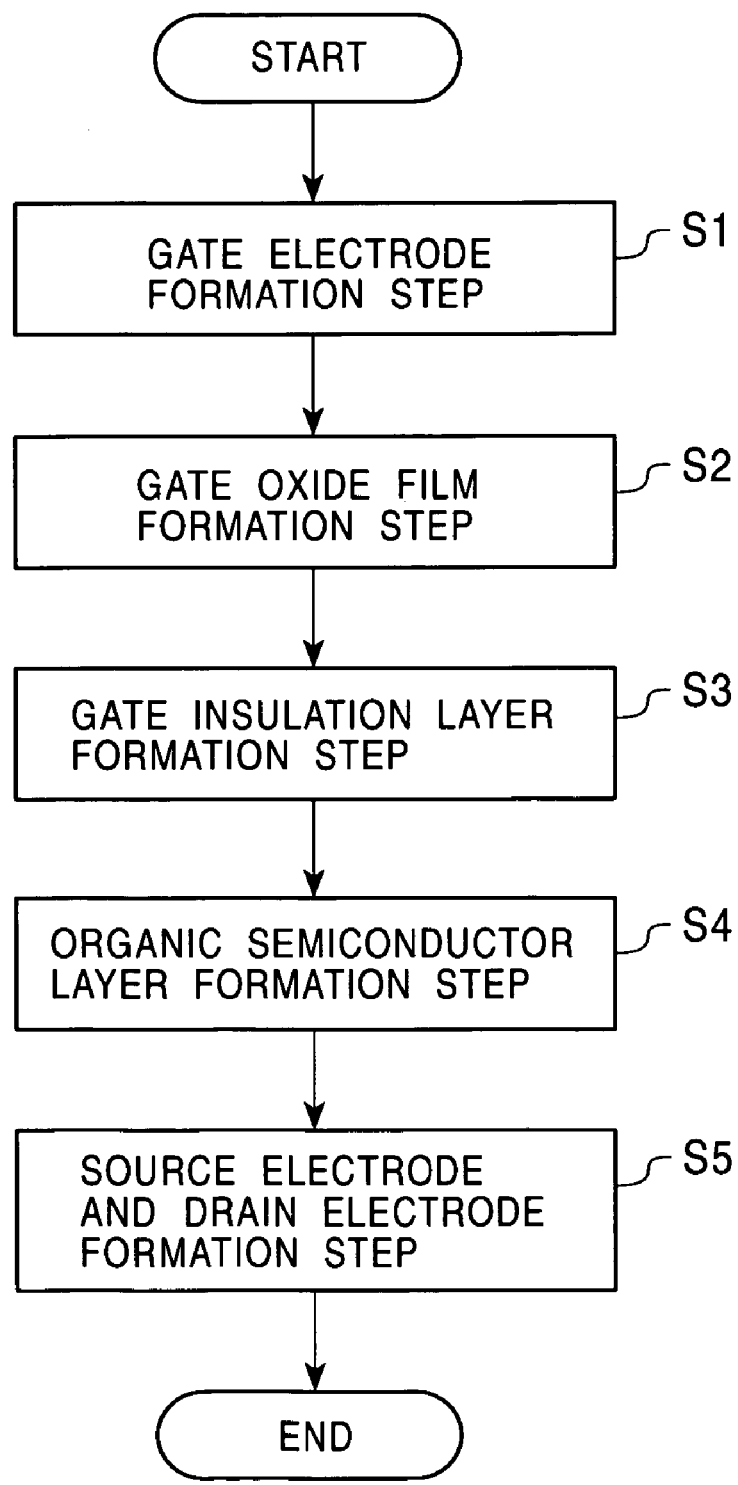

ORGANIC SEMICONDUCTOR ELEMENT HAVING HIGH INSULATION STRENGTH AND FABRICATION METHOD THEREOF

BACKGROUND OF THE INVENTION

1. Field of the Invention

The present invention relates to an organic semiconductor element and the fabrication method thereof.

2. Description of the Related Art

Semiconductors, which are used in a diode, a switch element required in signal processing and a transistor with an amplification function, necessitate physical characteristics such as a high carrier mobility, a low dark current, and a low drive voltage, and so forth. Therefore, an inorganic semiconductor such as silicon is generally used.

Investigations have been conducted into the usage of organic semiconductor elements whose semiconductor layer consists of an organic compound as drive elements for driving electrical elements consisting of organic electroluminescent or other organic materials. Because, in fabrication processes of electrical elements consisting of organic materials and organic semiconductor elements, the number of shared parts is high, there are advantages such that usage of the fabrication devices for the two elements can be shared.

As shown in FIG. 1, a thin film transistor 1 that uses an organic semiconductor thin film (hereinafter referred to as an organic TFT) is laminated, in order from a substrate 2, with a gate electrode 3, and a gate insulation layer 4 that surrounds and insulates the gate electrode 3, and an organic semiconductor layer 5 that acts as a current channel. A source electrode 6 and a drain electrode 7 are provided on the organic semiconductor layer 5. Materials used include Ni and Cr, or similar as the gate electrode 3, an inorganic material such as SiO2 or SiN or a resin such as polymethylmethacrylate (hereinafter referred to as PMMA) as the gate insulation layer 4, and pentacene or similar as the organic semiconductor layer 5.

By changing the electrical potential of the gate electrode of an organic TFT with such a constitution, it is possible to change the thickness of the depletion layer, which is a region in the organic semiconductor layer in which no carriers are present, and the current flowing between the source electrode and drain electrode can be controlled.

Among organic TFTs with the above constitution, a high organic semiconductor carrier mobility has been reported for an organic TFT 1 in which the gate insulation layer 4 is PMMA and the organic semiconductor layer 5 is pentacene, for example, in comparison with an organic TFT in which the gate insulation layer is SiO2.

Reference is to be made to "a lightweight and soft organic transistor changes the appearance of the display", Nikkei Electronics, Oct. 8, 2001; Vol. 806, Nikkei B P, pp. 55 to 62.

However, it has been ascertained that the organic TFT endurance characteristics are inadequate due to the low insulation strength of PMMA or other organic materials.

The above problem is cited as one example of a problem which the present invention is intended to resolve.

SUMMARY OF THE INVENTION

The organic semiconductor element according to the present invention is an organic semiconductor element comprising an organic semiconductor layer, which acts as a current channel; a gate insulation layer, which consists of an insulating material; a gate electrode, which lies opposite the semiconductor layer with the gate insulation layer interposed between the gate electrode and the semiconductor layer; and a source electrode and a drain electrode, which are each electrically connected to the two ends of the organic semiconductor layer, wherein a gate oxide film, which consists of a gate electrode material oxide, is included between the gate electrode and the gate insulation layer; and the gate insulation layer consists of an organic compound.

The fabrication method for the organic semiconductor element according to the present invention is a fabrication method for an organic semiconductor element that has an organic semiconductor layer, which acts as a current channel; a gate insulation layer, which consists of an insulating material; a gate electrode, which lies opposite the semiconductor layer with the gate insulation layer interposed between the gate electrode and the semiconductor layer; and a source electrode and a drain electrode, which are electrically connected to the two ends of the organic semiconductor layer, the fabrication method comprising: a gate electrode oxidation step of forming a gate oxide film by oxidizing a portion of the gate electrode; and a gate insulation layer formation step of forming the gate insulation layer consisting of an organic compound so as to cover the gate oxide film.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

and FIG. 4 is a flowchart for fabricating the organic semiconductor element of FIG. 2.

DETAILED DESCRIPTION OF THE INVENTION

An embodiment of the present invention will be described below with reference to the drawings.

Figure 1:
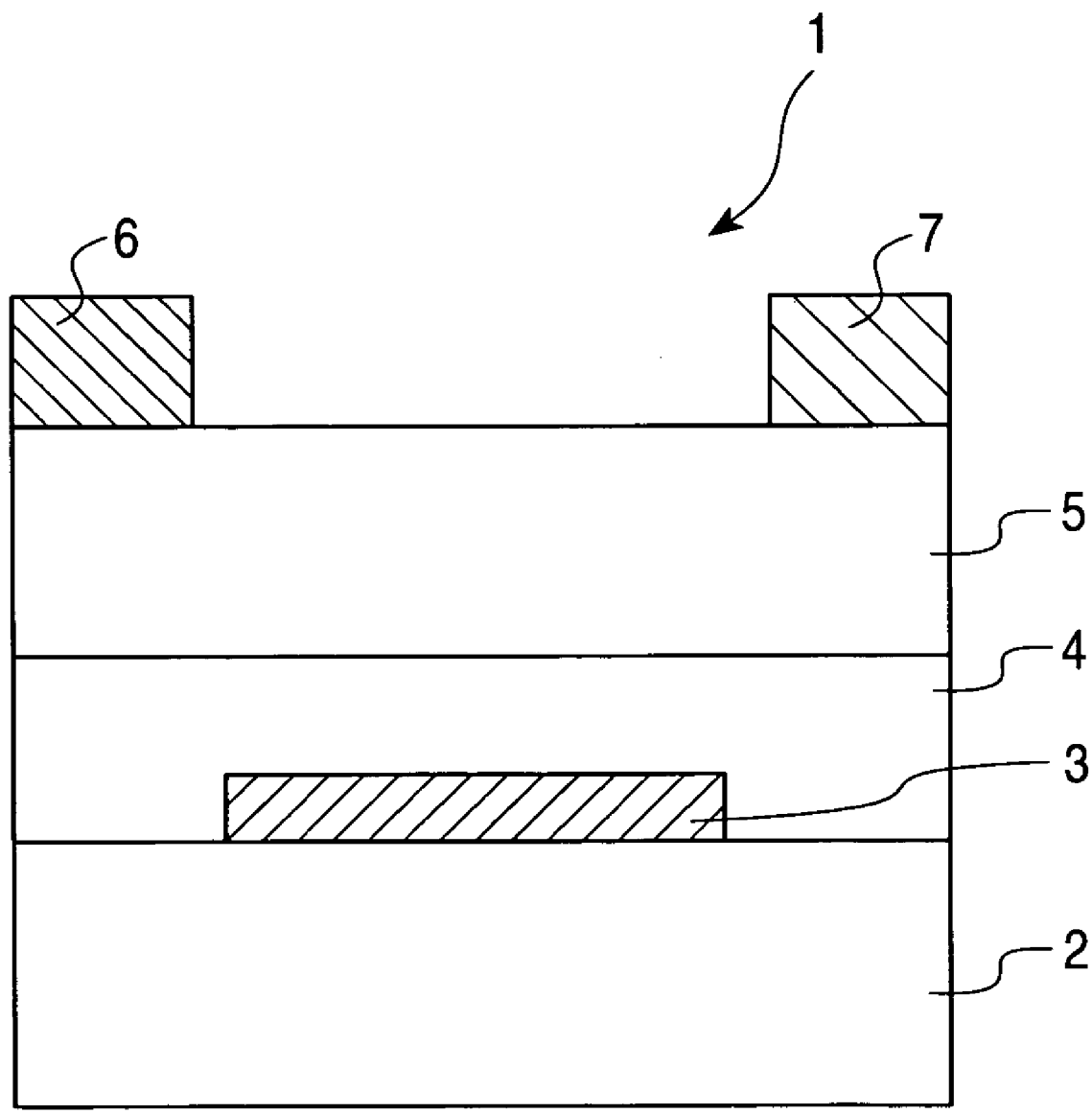
FIG. 1 is a cross-sectional view of the structure of a conventional organic semiconductor element.
Figure 2:
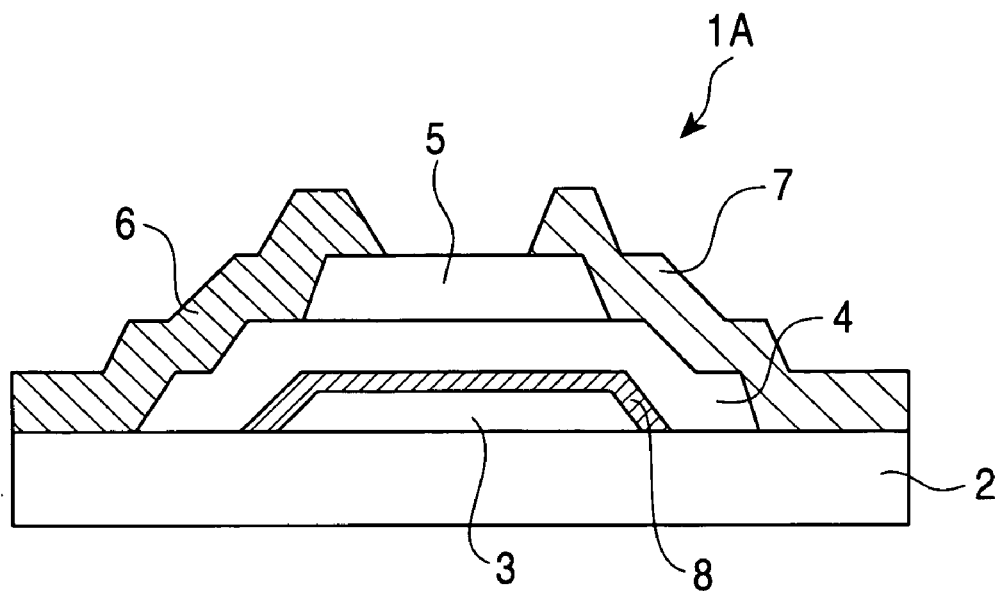
FIG. 2 is a cross-sectional view of the structure of a top-contact type organic semiconductor element according to the present invention.

As shown in FIG. 2, a top-contact type organic TFT 1A according to the present invention has a gate electrode 3 on a substrate 2 consisting of an insulating material such as glass or plastic. The gate electrode 3 consists of a metal such as Ta or Al.

A gate oxide film 8 consisting of a gate electrode material oxide is provided on the surface of the gate electrode 3. The gate oxide film 8 is obtained by oxidizing a portion, preferably the surface, of the gate electrode 3. For example, if the gate electrode is Ta, the gate oxide film is Ta2O5, and if the gate electrode is Al, the gate oxide film is Al2O3. The oxide film is formed by means of anode oxidation, for example.

A gate insulation layer 4 consisting of an organic compound is provided so as to cover the gate oxide film 8. The gate insulation layer 4 is formed from a resin that is soluble in an organic solvent or a resin that is obtained from a monomer or oligomer that is soluble in an organic solvent. Examples of usable materials include resins such as PMMA, parylene, polyethylene, polyvinylchloride, polyvinylidene fluoride, polycarbonate, polyphenylene sulfide, polyethylethylketone, polyethylsulphone, polyimide, phenol novolak, benzocyclobutene, polyvinylphenol, polychloropyrene, polyester, polyoxymethylene, polysulphone, and polyparaxylene, or monomers or oligomers of these resins.

Further, the gate insulation layer 4 is not limited to being composed of a single layer, and may instead consist of a plurality of organic insulation films.

Generally, metal oxides have an insulation strength which is high in comparison to that of organic oxides. Consequently, in a metal oxide-organic compound multiple layer insulation layer structure in which the gate insulation layer 4 is provided on the gate oxide film 8 as described above, even when the insulation strength of the gate insulation layer 4 consisting of an organic compound is low, a semiconductor element with an insulation strength that is high overall is obtained. Therefore, materials whose characteristics other than the insulation thereof are superior can also be used as the gate insulation layer (such as materials with superior heat resistance, materials permitting straightforward precision processing, and low-cost materials, for example).

The organic semiconductor layer 5 is provided on the gate insulation layer 4. The organic semiconductor layer 5 lies opposite the gate electrode 3, with the gate oxide film 8 and gate insulation layer 4 interposed between the organic semiconductor layer 5 and the gate electrode 3. Low molecular semiconductor materials and high molecular semiconductor materials can be employed as the material of the organic semiconductor layer 5.

Materials that may be listed as low molecular semiconductor materials are tetracene, chrysene, pentacene, pyrene, perylene, coronene, and other condensed aromatic hydrocarbons and derivatives thereof, as well as copper phthalocyanine, lutetium bisphthalocyanine or other porphyrins, and phthalocyanine compound metal complexes, for example.

Materials that may be listed as high molecular semiconductor materials are, for example, polyacetylene, polydiacetylene, polyacene, polyphenylenevinylene or other conjugated hydrocarbon polymers, and derivatives including oligomers of these conjugated hydrocarbon polymers, polyanilines, polythiophenes, polypyrrole, polyfuran, polypyridine, polythienylene vinylene or other conjugated heterocyclic polymers, and derivatives containing oligomers of these conjugated heterocyclic polymers.

The organic semiconductor layer 5 is not restricted to being composed of a thin film of a simple material, and may be a thin film doped with a dopant or a thin film that is made multilayered by using a plurality of organic semiconductor materials. The source electrode 6 and the drain electrode 7, which are electrically connected to the organic semiconductor layer 5, are provided on at least a portion, preferably in the vicinity of the ends, of the organic semiconductor layer 5, and on the gate insulation layer 4. Rh, Ir, Ni, Pd, Pt, Au, As, Se, Te, Al, Cu, Ag, Mo, W, Mg, Zn or similar is used for the source electrode 6 and the drain electrode 7.

Figure 3:
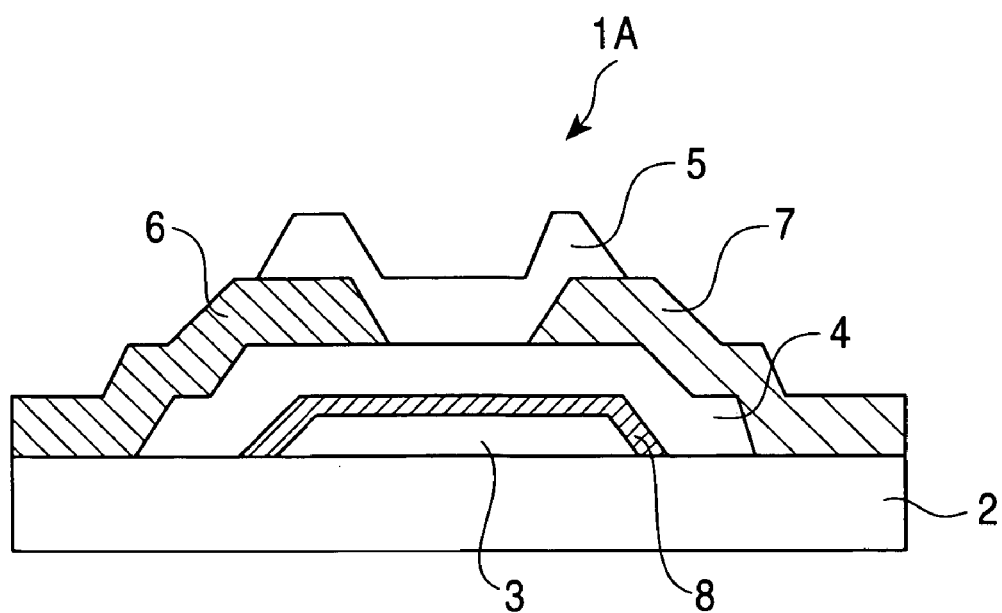
FIG. 3 is a cross-sectional view of the structure of a bottom-contact type organic semiconductor element according to the present invention.

As shown in FIG. 3, the organic TFT element is not restricted to the above structure, and instead may be an element with a bottom-contact type structure.

In addition, the gate electrode 3 is not limited to being the above material and may be made from a material permitting the formation of an oxide with an insulation characteristic. For example, Ti, Mg, and alloys thereof can be used.

Furthermore, the material of the gate insulation layer 4 may be a material that affords favorable crystal growth for the organic semiconductor element constituting the organic semiconductor layer 5 formed on the gate insulation layer 4, it being acceptable to use an organic material that raises the orientation of the semiconductor crystals, or the like, for example.

Further, an intermediate layer (not shown) containing an inorganic compound may be provided between the gate oxide film 8 and the gate insulation layer 4. The intermediate layer consists of an inorganic compound such as SiO2, SiN, or SiON, for example.

The organic TFT with the constitution described above is fabricated by means of the process shown in FIG. 4.

When reference is made to this process in combination with FIG. 3, in a gate electrode formation step S1, the gate electrode 3 consisting of Ta is provided on a substrate 2 by sputtering, for example. The film thickness of the gate electrode 3 is 2200 angstrom.

In a gate oxide film formation step S2, the gate oxide film 8, which is obtained by oxidizing the surface of the gate electrode 3, is formed by means of anode oxidation, for example. In the anode oxidation, with the gate electrode serving as the anode and a mesh-shaped Pt electrode serving as the cathode, for example, each substrate is immersed in a 1% phosphoric acid solution and a voltage of 70V is applied continuously for two hours to form the gate oxide film. By means of this anode oxidation, the gate electrode 3 is formed having Ta2O5 with a thickness of 980 angstrom thereon, and the Ta2O5 constitutes the gate oxide film 8. Because the gate oxide film 8 is obtained by oxidizing the gate electrode 3, the insulation layer can be formed without forming new insulating material on the gate electrode 3, whereby costs can be reduced.

The gate insulation layer formation step S3 comprises a resin material placement step and a resin curing step. The resin material placement step is a step in which a 2% PMMA propylene glycol monomethyl ethylacetate (PGMEA) solution is placed, by using spin-coating, on a substrate provided with the gate oxide film. The resin curing step is a step that cures the resin by heat-treating same for 30 minutes at 120° C. As a result of the gate insulation layer processing step S3, the gate insulation layer 4 consisting of PMMA of 700 angstrom is formed. Because the resin material is placed by means of spin coating, the ability to smoothen the resin surface is preferable.

In the organic semiconductor layer formation step S4, an organic semiconductor layer 5 consisting of 500A pentacene with large crystal grains is deposited on the gate insulation layer 4 by using vacuum vapor deposition. As described above, the surface of the gate insulation layer 4 constituting the underlayer is formed so as to be smooth, and, as a consequence, the pentacene molecules of the organic semiconductor layer 5 are easily aligned on the gate insulation layer 4, and hence the crystal grains are considered to be have coarsened.

In the source electrode and drain electrode formation step S5, the source electrode 6 and drain electrode 7 are placed on the gate insulation layer 4 and the organic semiconductor layer 5 by means of vacuum vapor deposition and are formed so as to be electrically connected to the organic semiconductor layer 5.

Further, the resin material placement step of the gate insulation layer placement step S3 is not limited to being a method involving the placement of a resin material by means of spin-coating as described above, a variety of deposition methods such as casting, Langmuir-Blodgett deposition (LB deposition), plasma polymerization, and CVD deposition being employable.

In addition, the resin curing step in the gate insulation layer placement step S3 is not restricted to a method involving curing by means of heating, and, instead, a curing method by means of light irradiation may be employed.

Further, an intermediate layer formation step that forms an intermediate layer containing an inorganic material may be included between the gate oxide film formation step S2 and the gate insulation layer formation step S3.

Characteristic measurement was carried out for the organic TFT obtained by means of the steps described above. In addition to a transistor constituting a comparison sample and in which the gate insulation layer 4 was not provided on the gate electrode 3, a transistor which had the same structure as the organic TFT of the present invention was used.

The carrier mobility of the organic TFT according to the present invention was 0.34 cm2/Vs. On the other hand, the carrier mobility of the comparison sample was 0.13 cm2/Vs. Because the gate insulation layer 4 consisting of an organic material is provided, an intermolecular force acts effectively between the material of the organic semiconductor layer 5 on the gate insulation layer, and the gate insulation layer material. Accordingly, the adhesiveness of the semiconductor material and insulation layer is raised, and, as a result, larger organic semiconductor crystals are formed and the carrier mobility is considered to be superior.

The insulation strength of a gate oxide film Ta2O5 formed by means of anode oxidation was 2.4 MV/cm. On the other hand, the insulation strength of the gate insulation layer consisting of PMMA was 2.0 kV/cm. Accordingly, the insulation strength of the overall element was improved by providing the gate oxide film 8 in addition to the gate insulation layer 4 consisting of an organic compound.

As detailed above, the organic semiconductor element according to the present invention is an organic semiconductor element that has an organic semiconductor layer 5, which acts as a current channel; a gate insulation layer 4, which consists of an insulating material; a gate electrode 3, which lies opposite the semiconductor layer 5 with the gate insulation layer 4 interposed between the gate electrode 3 and the semiconductor layer 5; and a source electrode 6 and drain electrode 7, which are each electrically connected to the two ends of the organic semiconductor layer 5, wherein a gate oxide film 8, which is produced by oxidizing a portion, preferably the surface, of the gate electrode 3, is included between the gate electrode 3 and the gate insulation layer 4 and the gate insulation layer 4 consists of an organic compound. With this organic semiconductor element, an organic semiconductor element with high carrier mobility can be obtained by using an organic compound with large crystal grains for the gate insulation layer. In addition, the insulation strength of the organic semiconductor element as a whole can be raised by providing a gate oxide film 8 that consists of a metal oxide.

Moreover, the fabrication method for the organic semiconductor element according to the present invention is a fabrication method for an organic semiconductor element that has an organic semiconductor layer 5, which acts as a current channel; a gate insulation layer 4, which consists of an insulating material; a gate electrode 3, which lies opposite the semiconductor layer 5 with the gate insulation layer 4 interposed between the gate electrode 3, and the semiconductor layer 5; and a source electrode 6 and drain electrode 7, which are each electrically connected to the two ends of the organic semiconductor layer 5, this fabrication method comprising: a gate electrode oxidation step of forming a gate oxide film 8 by oxidizing a portion, preferably the surface, of the gate electrode 3; and a gate insulation layer formation step of forming the gate insulation layer 4 consisting of an organic compound so as to cover the gate oxide film 8. Because the gate oxide film 8 is obtained by oxidizing a portion, preferably the surface, of the gate electrode 3, an organic semiconductor element of high insulation strength can be obtained without providing an additional step of forming new insulating material on the gate electrode 3.

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

This application is based on a Japanese patent application No. 2003-019995 which is incorporated herein by reference.

What is claimed is:

1. An organic semiconductor element, comprising:
   an organic semiconductor layer as a current channel;
   a gate insulation layer consisting of an organic compound that improves the crystal growth of said organic semiconductor layer formed thereon;
   a gate electrode consisting of a metal and opposing to said semiconductor layer so that said gate insulation layer is interposed between said gate electrode and said semiconductor layer;
   a source electrode and a drain electrode electrically connected in the vicinity of the two ends of the organic semiconductor layer respectively; and
   a gate oxide film consisting of a metal oxide obtained by oxidizing a gate electrode material between said gate electrode and said gate insulation layer.

2. The organic semiconductor element according to claim 1, wherein said organic compound is a resin that is soluble in an organic solvent.

3. The organic semiconductor element according to claim 1, wherein said organic compound is a resin that is obtained from a monomer or oligomer that is soluble in an organic solvent.

4. The organic semiconductor element according to claim 1, wherein said gate oxide film is formed by means of anode oxidation.

5. The organic semiconductor element according to claim 1, wherein said gate electrode consists of Al or Ta.

6. The organic semiconductor element according to claim 1, wherein said organic semiconductor layer consists of a low molecular organic compound.

7. The organic semiconductor element according to claim 1, wherein said organic semiconductor layer consists of a high molecular organic compound.

8. The organic semiconductor element according to claim 1, further comprising an intermediate layer consisting of an inorganic material between said gate oxide film and said gate insulation layer.

9. A fabrication method for an organic semiconductor element, said organic semiconductor element comprising: an organic semiconductor layer as a current channel, a gate insulation layer consisting of an organic compound that improves the crystal growth of said organic semiconductor layer formed thereon, a gate electrode consisting of a metal and opposing to said semiconductor layer so that said gate insulation layer is interposed between said gate electrode and said semiconductor layer; a source electrode and a drain electrode electrically connected in the vicinity of the two ends of the organic semiconductor layer respectively; and a gate oxide film consisting of a metal oxide obtained by oxidizing a gate electrode material between said gate electrode and said gate insulation layer, the fabrication method comprising:

a gate electrode oxidation step of forming a gate oxide film by oxidizing a portion of the gate electrode; and a gate insulation layer formation step of forming the gate insulation layer consisting of an organic compound so as to cover the gate oxide film.

10. The fabrication method according to claim 9, wherein said gate electrode oxidation step is an anode oxidation step.

11. The fabrication method according to claim 9, wherein said gate insulation layer formation step includes a resin material placement step of placing resin material by means of spin-coating.

12. The fabrication method according to claim 9, wherein said gate insulation layer formation step includes a resin curing step of performing resin curing by means of heat treatment.

13. The fabrication method according to claim 9, wherein said gate insulation layer formation step includes a resin curing step of performing resin curing by means of light irradiation.

14. The fabrication method according to claim 9, further comprising an intermediate layer formation step of forming an intermediate layer consisting of an inorganic material between said gate electrode oxidation step and said gate insulation layer formation step.

* * * * *